United States Patent
Hisamune et al.

(10) Patent No.: US 9,212,935 B2
(45) Date of Patent: Dec. 15, 2015

(54) ROTARY ENCODER

(71) Applicant: PANASONIC CORPORATION, Osaka (JP)

(72) Inventors: Hiroaki Hisamune, Okayama (JP); Kenji Kataoka, Okayama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 191 days.

(21) Appl. No.: 14/048,870

(22) Filed: Oct. 8, 2013

(65) Prior Publication Data

US 2014/0115910 A1 May 1, 2014

(30) Foreign Application Priority Data

Oct. 30, 2012 (JP) ................................ 2012-238660

(51) Int. Cl.
| | |
|---|---|
| *G01B 5/24* | (2006.01) |
| *G01B 7/30* | (2006.01) |
| *G01D 5/165* | (2006.01) |
| *G01B 3/56* | (2006.01) |
| *G01D 5/245* | (2006.01) |
| *H03M 1/26* | (2006.01) |
| *H03M 1/24* | (2006.01) |
| *G01D 5/249* | (2006.01) |

(52) U.S. Cl.
CPC .......... *G01D 5/1655* (2013.01); *G01D 5/2497* (2013.01); *G01D 5/245* (2013.01); *G01D 5/249* (2013.01); *G01D 5/2452* (2013.01); *H03M 1/24* (2013.01); *H03M 1/26* (2013.01)

(58) Field of Classification Search
CPC ..... G01D 5/249; G01D 5/245; G01D 5/2452; G01D 5/2497; G01D 5/1655; H03M 1/24; H03M 1/26; G01B 5/24

USPC .......................................... 33/1 PT, 1 N, 706
See application file for complete search history.

(56) References Cited

U.S. PATENT DOCUMENTS

| | | | | |
|---|---|---|---|---|
| 4,522,506 | A * | 6/1985 | Owa | 358/500 |
| 5,739,775 | A * | 4/1998 | Brandestini | 341/10 |
| 2004/0035688 | A1* | 2/2004 | Sugahara et al. | 200/6 R |
| 2004/0164879 | A1* | 8/2004 | Yoritsune et al. | 341/16 |

FOREIGN PATENT DOCUMENTS

| | | |
|---|---|---|
| JP | 08-313301 A | 11/1996 |
| JP | 10-511183 A | 10/1998 |
| WO | 96/19872 A1 | 6/1996 |

\* cited by examiner

*Primary Examiner* — Laura Martin
*Assistant Examiner* — Rhyan C Lange
(74) *Attorney, Agent, or Firm* — McDermott Will & Emery LLP

(57) ABSTRACT

A rotary encoder includes a rotatable conductor and first and second signal contacts. The rotatable conductor includes a first contact finger that slides on a track which is at least a part of a circle having a center point as a center thereof; and second contact finger that slides on the track and is located at an angular position different from an angular position of the first contact finger. The first signal contact is disposed on the track, and is configured to output a signal according to an angular position of the rotatable conductor about the center point. The second signal contact is disposed on the first track, and is configured to output a signal according to the angular position of the rotatable conductor about the center point. The second signal contact is electrically independent of the first signal contact. This rotary encoder includes a small number of tracks, and accordingly has a small size.

5 Claims, 14 Drawing Sheets

FIG. 5

| Position No. | Output Code | | | | Output of Terminal | | | |
|---|---|---|---|---|---|---|---|---|
| | 4th Bit | 3rd Bit | 2nd Bit | 1st Bit | 34D | 34C | 34B | 34A |
| 0 | 0 | 0 | 0 | 0 | | | | |
| 1 | 0 | 0 | 0 | 1 | | | | ▨ |
| 2 | 0 | 0 | 1 | 1 | | | ▨ | ▨ |
| 3 | 0 | 0 | 1 | 0 | | | ▨ | |
| 4 | 0 | 1 | 1 | 0 | | ▨ | ▨ | |
| 5 | 0 | 1 | 1 | 1 | | ▨ | ▨ | ▨ |
| 6 | 0 | 1 | 0 | 1 | | ▨ | | ▨ |
| 7 | 0 | 1 | 0 | 0 | | ▨ | | |
| 8 | 1 | 1 | 0 | 0 | ▨ | ▨ | | |
| 9 | 1 | 1 | 0 | 1 | ▨ | ▨ | | ▨ |
| 10 | 1 | 1 | 1 | 1 | ▨ | ▨ | ▨ | ▨ |
| 11 | 1 | 1 | 1 | 0 | ▨ | ▨ | ▨ | |
| 12 | 1 | 0 | 1 | 0 | ▨ | | ▨ | |
| 13 | 1 | 0 | 1 | 1 | ▨ | | ▨ | ▨ |
| 14 | 1 | 0 | 0 | 1 | ▨ | | | ▨ |
| 15 | 1 | 0 | 0 | 0 | ▨ | | | |

FIG. 8

| Position No. | Output Code | | | | Output of Terminal | | | |
|---|---|---|---|---|---|---|---|---|
| | 4th Bit | 3rd Bit | 2nd Bit | 1st Bit | 44D | 44C | 44B | 44A |
| 0 | 0 | 0 | 0 | 0 | | | | |
| 1 | 0 | 0 | 0 | 1 | | | | ▩ |
| 2 | 0 | 0 | 1 | 1 | | | ▩ | ▩ |
| 3 | 0 | 1 | 1 | 1 | | ▩ | ▩ | ▩ |
| 4 | 0 | 1 | 0 | 1 | | ▩ | | ▩ |
| 5 | 0 | 1 | 0 | 0 | | ▩ | | |
| 6 | 1 | 1 | 0 | 0 | ▩ | ▩ | | |
| 7 | 1 | 1 | 0 | 1 | ▩ | ▩ | | ▩ |
| 8 | 1 | 1 | 1 | 1 | ▩ | ▩ | ▩ | ▩ |
| 9 | 1 | 0 | 1 | 1 | ▩ | | ▩ | ▩ |
| 10 | 1 | 0 | 0 | 1 | ▩ | | | ▩ |
| 11 | 1 | 0 | 0 | 0 | ▩ | | | |

FIG. 14
PRIOR ART

| Position No. | Output Code | | | | Output of Terminal | | | |
|---|---|---|---|---|---|---|---|---|
| | 4th Bit | 3rd Bit | 2nd Bit | 1st Bit | 12D | 12C | 12B | 12A |
| 0 | 0 | 0 | 0 | 0 | | | | |
| 1 | 0 | 0 | 0 | 1 | | | | ■ |
| 2 | 0 | 0 | 1 | 1 | | | ■ | ■ |
| 3 | 0 | 0 | 1 | 0 | | | ■ | |
| 4 | 0 | 1 | 1 | 0 | | ■ | ■ | |
| 5 | 0 | 1 | 1 | 1 | | ■ | ■ | ■ |
| 6 | 0 | 1 | 0 | 1 | | ■ | | ■ |
| 7 | 0 | 1 | 0 | 0 | | ■ | | |
| 8 | 1 | 1 | 0 | 0 | ■ | ■ | | |
| 9 | 1 | 1 | 0 | 1 | ■ | ■ | | ■ |
| 10 | 1 | 1 | 1 | 1 | ■ | ■ | ■ | ■ |
| 11 | 1 | 1 | 1 | 0 | ■ | ■ | ■ | |
| 12 | 1 | 0 | 1 | 0 | ■ | | ■ | |
| 13 | 1 | 0 | 1 | 1 | ■ | | ■ | ■ |
| 14 | 1 | 0 | 0 | 1 | ■ | | | ■ |
| 15 | 1 | 0 | 0 | 0 | ■ | | | |

ROTARY ENCODER

TECHNICAL FIELD

The present invention relates to a rotary encoder used for an input operating section of various electronic devices.

BACKGROUND ART

Absolute-type rotary encoders are widely used for an input operating section of electronic devices to control various functions of the electronic devices.

FIG. 10 is a cross-sectional view of conventional absolute-type rotary encoder 500. In rotary encoder 500, operating knob 2 retained rotatably to main body 1 protrudes upward from main body 1. Main body 1 includes case 3 made of insulating resin, and bearing 4 disposed above case 3. Bearing 4 includes cylinder 4A protruding upward, and flange 4B provided at a base of cylinder 4A. Flange 4B has a shape substantially identical to that of an upper surface of case 3. Flange 4B is disposed on the upper surface of case 3. Metallic cover 5 covers flange 4B. Leg 5A of cover 5 is crimped to be fixed on a lower surface of case 3, thereby fixing bearing 4 unitarily with case 3. Operating knob 2 upwardly protrudes through cylinder 4A of bearing 4 and is rotatably held on an inside wall of cylinder 4A.

Case 3 has a recess opening upward. The recess has substantially a circular shape in view from above. Contact pattern 6 for the absolute-type encoder is provided on a bottom surface of the recess. Rotatable conductor 7 having elasticity is fixed by crimped onto a lower surface of a circular plate disposed under operating knob 2. Rotatable conductor 7 is a spring made of conductive material, such as thin sheet metal, with resiliency.

FIG. 11 is a plan view of rotatable conductor 7. Rotatable conductor 7 has contact fingers 8 and 9A to 9D. Contact fingers 8 and 9A to 9D elastically contact predetermined positions on the bottom surface of the recess.

Recesses and protrusions extending radially are formed on the upper surface of the circular plate of operating knob 2. A click spring is fixed at a lower section of bearing 4 bycrimping. Upon rotating, operating knob 2 causes the recesses and the protrusions to elastically contact the click spring, producing the operator a click feel by a predetermined rotation angle.

An operation of rotary encoder 500 will be detailed below. FIG. 12 is a schematic view of rotary encoder 500 for illustrating contact pattern 6 and positions of contact fingers 8 and 9A to 9D. FIG. 13 is a schematic view of rotary encoder 500 for illustrating positional relation between contact pattern 6 and contact fingers 8 and 9A to 9D according to the rotation of operating knob 2. FIG. 14 shows output codes corresponding to angular positions of operating knob 2 of rotary encoder 500.

Upon operating knob 2 rotating, contact fingers 8 and 9A to 9D of rotatable conductor 7 are connect and disconnect with contact pattern 6 in the recess and provide contact pattern 6 with a predetermined a contact/non-contact state, consequently output predetermined output signals according to angular positions of operating knob 2 from signal terminals 12A to 12D that are led out of a side surface of case 3.

Case 3 is form by insert molding wiring board 13 such that an upper surface of wiring board 13 is exposed at the bottom surface of the recess of case 3. Predetermined contact pattern 6 is provided on the upper surface of wiring board 13 exposed at the recess.

Contact pattern 6 includes common contact 14 positioned at a center of the recess and signal contacts 15A to 15D surrounding common contact 14. Common contact 14 has a common potential and has an annular shape with a predetermined width. Signal contacts 15A to 15D are electrically independent of each other, and have substantially horseshoe shapes that extend in the circumferential direction so as to surround common contact 14 located at the center. As shown in FIG. 12, contact pattern 6 disposed on the bottom surface of the recess includes five circular tracks, track 514 and tracks 515A to 515D. Circular tracks 514, 515A to 515D are concentric circles. Common contact 14 and signal contacts 15A to 15D extend along the tracks. Signal contacts 15C, 15D, 15A, and 15B are arranged in this order radially away from common contact 14 located at the center of the recess. Each of signal contacts 15A to 15D has a wide part with a large width in the radial direction and a narrow part with a small width in the radial direction at a predetermined angular position.

Common contact 14 and signal contacts 15A to 15D are led out with wiring patterns disposed on wiring board 13 to an outer edge of wiring board 13. Common terminal 11 and signal terminals 12A to 12D made of metal plates are led out of the side surface of case 3. Common contact 14 and signal contacts 15A to 15D are connected to common terminal 11 and signal terminals 12A to 12D, respectively.

The wiring patterns disposed on the upper surface of wiring board 13 is covered with a resist material so as not to expose the wiring patterns to the outside. That is, only common contact 14 and signal contacts 15A to 15D of contact pattern 6 are exposed to an upper surface of wiring board 13 at the bottom surface of the recess of case 3.

Contact fingers 8 and 9A to 9D of rotatable conductor 7 are arranged along a diameter of the circular shape of the recess of case 3. FIG. 12 schematically illustrates positions of contact fingers 8 and 9A to 9D of rotatable conductor 7. Contact fingers 8, 9C, 9D, 9A, and 9B are arranged on circular tracks 514, 515C, 515D, 515A, and 515B of common contacts 14, 15C, 15D, 15A, and 15B, respectively. An angular position of contact finger 9A disposed on circular track 515A for signal contact 15A is a reference position (i.e., at an angular position of 0 degree), contact fingers 9C and 9D are located at angular positions different from the angular position of contact finger 9A by about 180 degrees about the center of wiring board 13. Contact finger 9B is disposed at an angular position (0 degree) identical to that of contact finger 9A. Contact finger 8 contacting common contact 14 is located at an angular position different from the angular position 9A by about 180 degrees. FIG. 12 illustrates the positional relation of common contact 14 and signal contacts 14A to 14D when operating knob 2 is positioned at position No. 0 (i.e., at an angular position of 0 degree).

Upon rotating, operating knob 2 causes rotatable conductor 7 held by operating knob 2 to rotate, accordingly causing contact fingers 8 and 9A to 9D of rotatable conductor 7 to slide on common contact 14 and signal contacts 15A to 15D along circular track 514 and circular tracks 515A to 515D, respectively. Contact finger 8, sliding on common contact 14 along circular track 514 contacts an upper surface of common contact 14 along the entire circumference. Contact fingers 9A to 9D sliding on signal contacts 14A to 14D along circular tracks 514A to 514D, respectively, slide on the wide parts of signal contacts 15A to 15D while not contacting the narrow parts of signal contacts 15A to 15D, respectively. This structure allows common contact 14 to connect and disconnect with signal contacts 15A to 15D according to the angular position of operating knob 2.

In conventional rotary encoder 500, operating knob 2 is rotatable without limits. For one complete rotation of operating knob 2, an output signal is cyclically obtained at 16 angular positions (position No. 0-15). The rotation angle of operating knob 2 between adjacent angular positions is determined to 22.5°.

FIG. 13 schematically shows the positions of contact fingers 8 and 9A to 9D of rotatable conductor 7 when operating knob 2 is positioned at an angular position of position No. 1 after rotating clockwise by one position (22.5 degrees) from position No. 0 shown in FIG. 12. At position No. 1, contact finger 9A contacts signal contact 15A while contact fingers 9B to 9D do not contact signal contacts 15B to 15D, respectively. This arrangement allows signal contact 15A only to have the same potential as common contact 14, and allows signal contacts 15B to 15D to open. As a result, rotary encoder 500 outputs an output code, "0001" via signal terminals 12A to 12D.

FIG. 14 shows output codes corresponding to angular positions of operating knob 2. Rotary encoder 500 includes four signal contacts 15A to 15D and provides 4-bit output codes having first to fourth bits to allow the angular positions of position Nos. 0-15 of operating knob 2 to be detected. In FIG. 14, the first to fourth bits of the output codes correspond to the output signals output from signal contacts 12A to 12D, respectively. When signal contacts 15A to 15D contact signal terminals 12A to 12D, respectively, signal terminals 12A to 12D have the common potential. This status is represented by "1". The status in which When signal terminals 12A to 12D do not contact signal terminals 12A to 12D is represented by "0". In rotary encoder 500, the first bit is the least significant bit (LSB) of the output signal, and the fourth bit 4 is the most significant bit (MSB) of the output signal. For example, when operating knob 2 is located at position No. 0 shown in FIG. 12, the output code is "0000". When operating knob 2 is located at position No. 1 shown in FIG. 13, the output code is "0001". Upon rotating further clockwise from position No. 1 shown in FIG. 13, operating knob 2 moves consequently to positions of position Nos. 2 to No. 15.

Signal contacts 15A to 15D are connected and disconnected with contact fingers 9A to 9D at angular positions of position Nos. 2 to 15, accordingly providing the output codes corresponding to position Nos. 2 to 15 shown in FIG. 14

As described above, contact fingers 9A to 9D of rotatable conductor 7 slide on signal contacts 15A to 15D along circular tracks 515A to 515D, respectively. Contact fingers 9A to 9D are connected and disconnected with signal contacts 15A to 15D according to the angular position of operating knob 2, respectively, thereby outputting signals of the output codes according to the angular position of operating knob 2 from signal terminals 12A to 12D.

The output code is a binary number having four bits corresponding to signal terminals 12A to 12D. The output code of the four bits is a Gray code in which only one bit out of four bits changes between output codes corresponding to any pair of angular positions Nos. 0 to 15 adjacent to each other.

A conventional rotary encoder similar to rotary encoder 500 is disclosed in, for example, Japanese Patent Paid-Open Publication Nos. 10-511183 and 08-313301.

SUMMARY

A rotary encoder includes a rotatable conductor and first and second signal contacts. The rotatable conductor includes a first contact finger that slides on a track which is at least a part of a circle having a center point as a center thereof; and second contact finger that slides on the track and is located at an angular position different from an angular position of the first contact finger. The first signal contact is disposed on the track, and is configured to output a signal according to an angular position of the rotatable conductor about the center point. The second signal contact is disposed on the first track, and is configured to output a signal according to the angular position of the rotatable conductor about the center point. The second signal contact is electrically independent of the first signal contact.

This rotary encoder includes a small number of tracks, and accordingly has a small size.

BRIEF DESCRIPTION OF THE DRAWINGS

FIG. 5 shows output codes obtained by the rotary encoder in accordance with Embodiment 1.

FIG. 8 shows output codes obtained by the rotary encoder in accordance with Embodiment 2.

FIG. 14 shows output codes obtained by the conventional rotary encoder.

DETAILED DESCRIPTION OF PREFERRED EMBODIMENTS

Exemplary Embodiment 1

Figure 1:
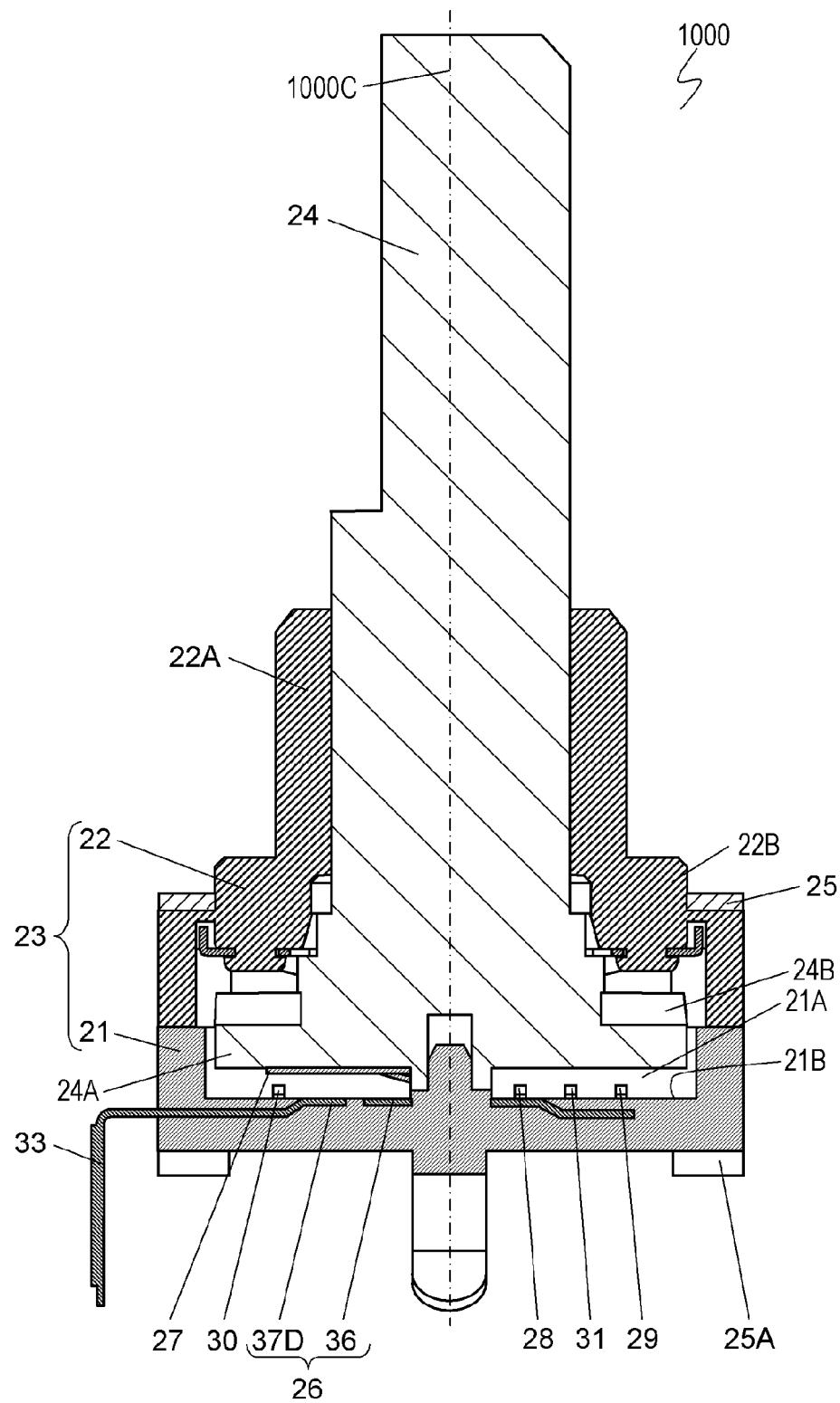
FIG. 1 is a cross-sectional view of a rotary encoder in accordance with Exemplary Embodiment 1 of the present invention.

FIG. 1 is a cross-sectional view of rotary encoder 1000 in accordance with Exemplary Embodiment 1 of the present invention. Rotary encoder 1000 includes main body 23 and operating knob 24 that protrudes from main body 23. Main body 23 includes bearing and case 21 made of insulating resin. Operating knob 24 is retained by cylinder 22A of bearing 22 while being rotatable about center axis 1000C. Metallic cover 25 covers flange 22B. Leg 25A of metallic cover 25 is crimpled to be fixed on a lower surface of case 21 to fix bearing 22 unitarily with case 21.

Case 21 has recess 21A opening upward and having substantially a circular shape in view from above. Contact pattern 26 for the absolute-type encoder is disposed on bottom surface 21B of recess 21A.

Operating knob 24 includes flange 24A having a disk shape sticking out of the lower part of operating knob 24. Plural projections 24B extending radially are provided on an upper surface of flange 24A. A click spring is fixed at a lower part of bearing 22 bycrimping. Upon rotating about center axis 1000C, operating knob 24 causes projections 24B to elastically contact the click spring, producing a click feel at predetermined rotation angles during the rotation. Rotatable conductor 27 is fixed by crimping onto the lower part of operating knob 24.

Figure 2:
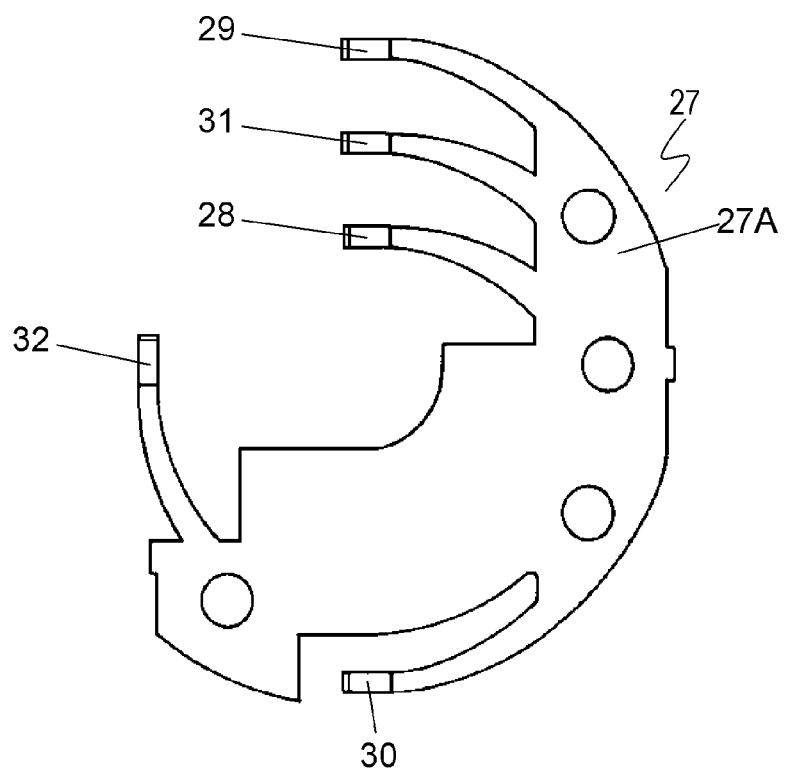
FIG. 2 is a plan view of a rotatable conductor of the rotary encoder in accordance with Embodiment 1.

FIG. 2 is a plan view of rotatable conductor 27. Rotatable conductor 27, made of conductive material, such as a thin metal sheet, having elasticity, includes base 27A and contact fingers 28 to 32 extending from base 27A. Contact fingers 28 to 32 contact and do not contact predetermined positions of contact pattern 26, and connect rotatable conductor 27 with contact pattern 26 at predetermined angular positions, thereby outputting predetermined output signals from signal terminals 34A to 34D. Contact fingers 28 to 32 of rotatable conductor 27 have the same potential.

Figure 3:
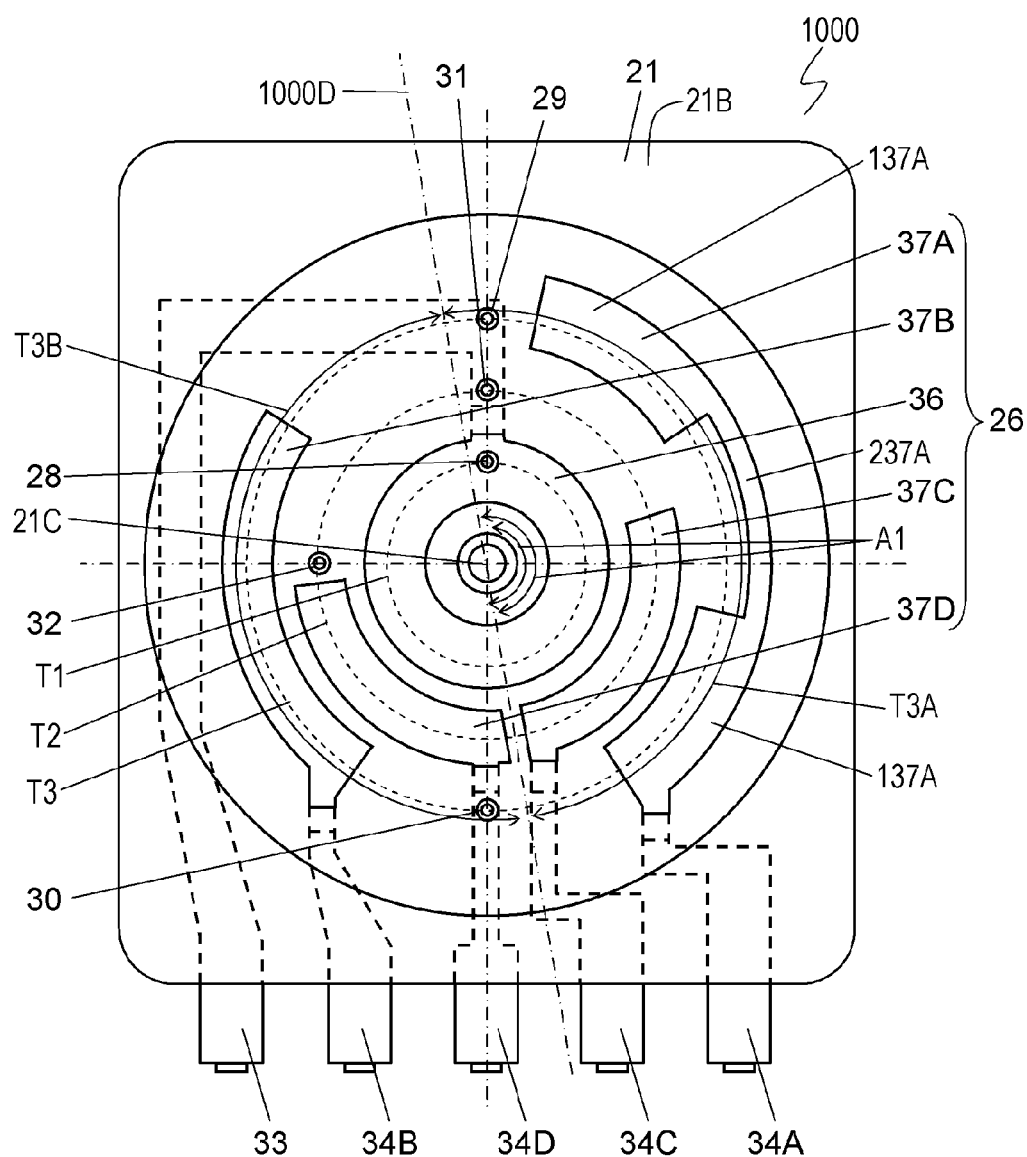
FIG. 3 is a schematic view of the rotary encoder in accordance with Embodiment 1.
Figure 4:
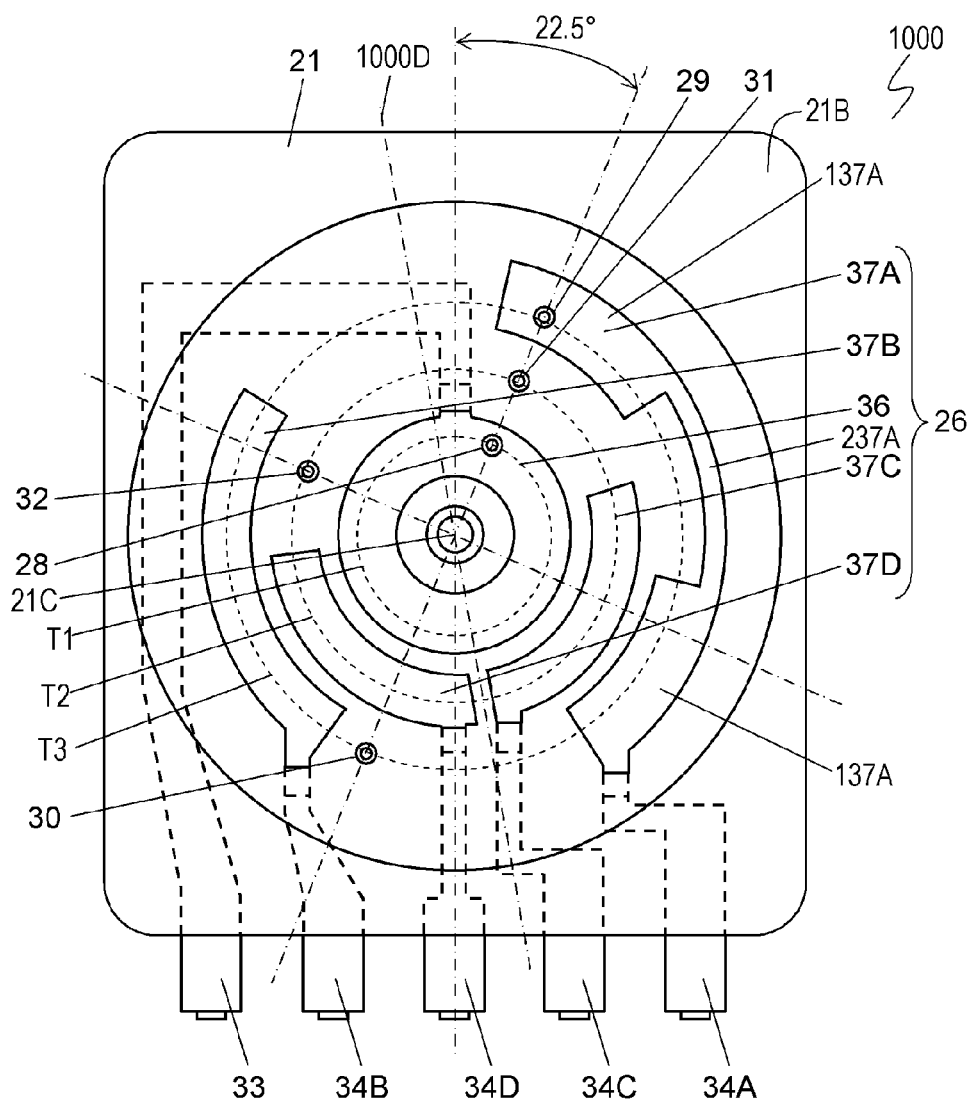
FIG. 4 is a schematic view of the rotary encoder in accordance with Embodiment 1.

The structures of contact pattern 26 and contact fingers 28 to 32 of rotatable conductor 27 and output codes obtained according to the rotation of operating knob 24 will be described below. FIGS. 3 and 4 show schematic views of contact pattern 26 of rotary encoder 1000.

Center axis 1000C of the rotation of operating knob 24 crosses bottom surface 21B of recess 21A at center point 21C. Contact pattern 26 provided on bottom surface 21B of recess 21A of case 21 includes common contact 36 and plural signal contacts 37A to 37D. Common contact 36 and signal contacts 37A to 37D are formed by insert molding as to be exposed to an outside of bottom surface 21B of recess 21A. Common contact 36 is located at a center portion including center point 21C. Signal terminals 34A to 34D are led out of a side surface of case 21. Signal contacts 37A to 37D are located at positions radially arranged outward from center point 21C. Common contact 36 and signal contacts 37A to 37D are made of conductive material, such as a thin metal sheet, and are electrically independent of each other. Common contact 36 has an annular shape about center point 21C having a predetermined width. Common contact 36 and signal contacts 37A to 37D are connected to common terminal 33 and signal terminals 34A to 34D, respectively.

Contact pattern 26 includes tracks T1 to T3 which are three concentric circles about center point 21C. Tracks T1, T2, and T3 are radially arranged in this order in a direction away from center point 21C. Common contact 36 is provided on track T1 closest to center point 21C among the three tracks, and covers entirely track T1. Signal contacts 37C and 37D with a predetermined width are disposed on track T2 second closest to center point 21C after track T1. Signal contacts 37C and 37D are electrically independent of each other. Signal contacts 37A and 37B with a predetermined width are disposed on track T3 third closest to center point 21C after track T2, that is, farthest from center point 21C. Signal contacts 37A and 37B are electrically independent of each other. Signal contact 37A has wide part 137A having a large width in a radial direction and narrow part 237A having a smaller width than wide part 137A in the radial direction which are located according to an angular position about center point 21C.

The positional relation between contact fingers 28 to 32 of rotatable conductor 27 will be described below. Upon the rotation of rotatable conductor 27 about center point 21C according to the rotation of operating knob 24 about center axis 1000C, contact finger 28 elastically slides on track T1, contact fingers 29 and 30 elastically slide on track T2, and contact fingers 31 and 32 elastically slide on track T3. FIGS. 3 and 4 show the positional relation between contact fingers 28 to 32 on track T1 to T3. Contact finger 30 is located at an angular position different from contact finger 29 by an angle of 180 degrees. Contact finger 31 is located at an angular position identical to that of contact finger 29. Contact finger 32 is located at an angular position from contact finger 31 by an angle of 90 degrees (having a phase delaying by 90 degrees). Contact finger 28 is located at an angular position identical to angular positions of contact fingers 29 and 31.

Upon rotating operating knob 24 about center axis 1000C, rotatable conductor 27 fixed to operating knob 24 rotates together, and causes contact fingers 28 to 32 of rotatable conductor 27 to slide on tracks T1 to T3 concentrically arranged about center point 21C. Contact finger 28 sliding on track T1 contacts an upper surface of common contact 36 entirely. Contact fingers 29 and 30 sliding on track T3 contact and are removed from part 137A of signal contact 37A and signal contact 37B at predetermined angular positions. Contact fingers 31 and 32 sliding on track T2 contact and are removed from signal contacts 37C and 37D at predetermined angular positions.

Contact finger 28 continues contacting common contact 36 regardless of the angular position of rotatable conductor 27. While rotatable conductor 27 has contact fingers 29 to 32 to contact signal contacts 37A to 37D, signal terminals 34A to 24D connected to signal contacts 37A to 37D, respectively, are connected with common contact 36 and have the same potential as common contact 36. Upon being removed from signal contacts 37A to 37D, contact fingers 29 to 32 are disconnected with common contact 36. According to Embodiment 1, signal contacts 37A to 37D connected with common terminal 33 (common contact 36) provide an output code with a value of "1", while signal contacts 37A to 37D removed from common terminal 33 provide an output code with a value of "0". The value provided from signal terminal 34A constitutes the least significant bit (LSB). The values provided from signal terminals 34B and 34C constitute higher bits. The value provided from signal terminal 34D constitutes the most significant bit (MSB). Signal terminals 34A to 34D thus provide an output code having four bits.

The position of rotatable conductor 27 having contact fingers 28 to 32 shown in FIG. 3 is defined as a position of position No. 0, a reference position. Upon operating knob 24 rotating clockwise from position No. 0 by one angular position as a predetermined increment of angle: 22.5 degrees in view from above, contact fingers 28 to 32 move to position No. 1, as shown in FIG. 4. Contact finger 29 located at position No. 1 shown in FIG. 4 contacts signal contact 37A while contact fingers 30, 31, and 32 at position No. 1 are removed from the signal contacts. That is, signal contact 37A only has the same potential as common contact 36, and signal contacts 37B to 37C are removed from common contact 36, hence outputting an output code of "0001" from signal terminals 34A to 34D.

Upon rotating further clockwise by 22.5 degrees from position No. 1 shown in FIG. 4, operating knob 24 is located at position No. 2 that is the angular position of operating knob 24 after the rotation by 45 degrees from position No. 0 as the reference position. At position No. 2, contact finger 29 continues contacting signal contact 37A, contact finger 30 contacts signal contact 37B, and contact fingers 31 and 32 are removed from the signal contacts. That is, like signal contact 37A, signal contact 37B has the same potential as common contact 36, outputting an output code of "0011" from signal terminals 34A to 34D.

Upon operating knob 24 rotating about center axis 1000C by a predetermined angular increment, 22.5 degrees, contact fingers 29 to 32 of rotatable conductor 27 is connected and disconnected with signal contacts 37A to 37D at angular positions out of position Nos. 3 to 15 of operating knob 24.

FIG. 5 is output codes output at angular positions of position Nos. 0 to 15) of operating knob 24. The output code shown in FIG. 5 has four bits, a first bit which is the LSB, a second bit more significant than the first bit, a third bit more significant than the second bit, and a fourth bit that is the MSB. In the output from the terminals shown in FIG. 5, the status that signal contacts 34A to 34D have the same potential as common contact 36 and output the output code having a value of "1" is represented by a shaded cell while the status that signal contacts 34A to 34D are removed from common contact 36 and output an output code having a value of "0" is represented by a blank cell. That is, when operating knob 24 is located at position No. 0 shown in FIG. 3, an output code of "0000" listed on a row of position No. 0 shown in FIG. 5 is output. Similarly, when operating knob 24 is located at position No. 1 shown in FIG. 4, an output code of "0001" on a row of position No. 1 shown in FIG. 5) is output. When operating knob 24 is located at positions of position Nos. 0 to 15, output codes corresponding to the positions are output. The output codes are Gray codes.

In rotary encoder 1000 according to Embodiment 1, according to a regularity of the Gray codes, two signal contacts are disposed on a single track to share the track, providing rotary encoder 1000 with a small size. The regularity of the Gray codes will be described below.

As illustrated by the black cells and the shaded cells shown in FIG. 5, except for the fourth bit which is the MSB (i.e. the output of signal terminal 34D), the pattern defined by the blank cells and the shaded cells of the first to third bits exhibits an mirror image with respect to the boundary angular position between position No. 7 and position No. 8. That is, the pattern is symmetrical about middle angular position 1000D that divides 16 positions (Nos. 0 to 15) in half. As for the fourth bit as the MSB, the cells from position Nos. 0 to 7 before middle angular position 1000D are all blank cells, whereas the cells from position Nos. 8 to 15 after middle angular position 1000D are all shaded cells.

The pattern described above conforms to functions as follows. Having the value of "0" in the output code shown in FIG. 5 replaced with a value of "−1", each of the signals output from signal contacts 37A to 37C, i.e., signal terminals 34A to 34C, for the first to third bits other than the MSB conforms to an even function with respect to middle angular position 1000D of rotatable conductor 27 as an origin. The signal of the fourth bit, the MSB, signals output from signal contact 37D, i.e., signal terminal 34D conforms to an odd function with respect to the middle angular position 1000D of rotatable conductor 27 as the origin.

In each of the first and second bits, the order of the values from position Nos. 0 to 7 is identical to the order of the values from position Nos. 8 to 15. That is, the values at position Nos. 0 to 7 are repeated in the cells at position Nos. 8 to 15 in this order.

Based on the above regularity, as shown in FIGS. 3 and 4, signal contacts 37A and 37B corresponding to the first and second bits, respectively, are disposed on track T3 farthest from center point 21C. Specifically, signal contact 37A is disposed on the first half of track T3 corresponding to position Nos. 0 to 7). Signal contact 37A has a pattern of an output of signal terminal 34A from position Nos. 0 to 7 shown in FIG. 5. Further, signal contact 37B is disposed on the second half of track T3 corresponding to position Nos. 8 to 15, respectively. Signal contact 37B has a pattern of an output of signal terminal 34B from position Nos. 0 to 7.

Contact fingers 29 and 30 of rotatable conductor 27 sliding on track T3 are arranged at angular positions different from each other by about 180 degrees corresponding to the eight increments of the angular positions.

That is, in the positions from position Nos. 0 to 7, contact finger 29 slides on signal contact 37A on track T3, and signal terminal 34A outputs the output codes corresponding to terminal output 34A from position Nos. 0 to 7 shown in FIG. 5. In the positions from position Nos. 8 to 15, contact finger 30 slides on signal contact 37A on track T3, and therefore, signal terminal 34A again outputs the output codes corresponding to terminal output 34A from position Nos. 0 to 7 shown in FIG. 5.

Since the output codes of terminal output 34A from position Nos. 8 to 15 are the same as those from position Nos. 0 to 7, signal terminal 34A outputs the output codes corresponding to position Nos. 0 to 7.

In the position from position Nos. 0 to 7, contact finger 29 slides on signal contact 37A on track T3; while contact finger 30 slides on signal contact 37B on track T3. This operation allows signal terminal 34B to output the output codes corresponding to outputs of terminal 34B from position Nos. 0 to 7 shown in FIG. 5.

Further, in the positions from position Nos. 8 to 15, contact finger 29 slides on signal contact 37B on track T3, and signal terminal 34B outputs again the output code corresponding to outputs of terminal 34B from position Nos. 0 to 7 shown in FIG. 5.

Since the output codes of terminal output 34B from position Nos. 8 to 15 are the same as those from position Nos. 0 to 7, signal terminal 34B outputs the output codes corresponding to position Nos. 0 to 15.

The above structure allows signal contact 37A constituting to the output of the first bit and signal contact 37B constituting the output of the second bit can be disposed on the same track T3.

As described above, signal contact 37A having a pattern of the output of signal terminal 34A from position Nos. 0 to 7 shown in FIG. 5 is disposed on the first half of circular track T3 corresponding to the positions from position Nos. 0 to 7). On the other hand, signal contact 37B having a pattern of the outputs of signal terminal 34B from position Nos. 0 to 7 shown in FIG. 5 is disposed on the second half of circular track T3 corresponding to the positions from position Nos. 8 to 15). Contact fingers 29 and 30 located at the angular positions different from each other by about 180 degrees, i.e., eight increments of the angular positions, allows two signal contacts 37A and 37B to be disposed on the same track (track T3).

The regularity of the third and fourth bits of the output code will be described below. The third and fourth bits correspond to terminal outputs 34C and 34D, respectively. Each of outputs of terminals 34C and 34D has eight shaded cells consecutively arranged within position Nos. 0 to 15, as shown in FIG. 5, and the other cells are blank cells. The output code of the fourth bit (MSB) shift advances the output code of the third bit next to the MSB by four bits.

In Gray code of n-bit (n is a natural number not smaller than 2), the n-th bit as the MSB and the (n−1)-th bit have the code described above. Each of the outputs from the n-th bit and the (n−1)-th bit has shaded cells arranged consecutively by $2^n/2$, and the other cells are blank cells. The output code of the n-th bit advances the output code of the (n−1)-th bit by ($2^n/4$).

Based on the above regularity, in rotary encoder 1000 according to Embodiment 1, signal contacts 37C and 37D are disposed on circular track T2 that is the second closest to center point 21C.

To be specific, signal contact 37C having the pattern of the output of signal terminal 34C from position Nos. 0 to 7 shown in FIG. 5 is disposed on the first half from position Nos. 0 to 7 of track T2. Signal contact 37D having the pattern of the output of signal terminal 34D from position Nos. 8 to 11 shown in FIG. 5 is disposed on the positions from position Nos. 8 to 11 of track T2.

Contact fingers 31 and 32 of rotatable conductor 27 sliding on track T2 are located at angular positions different from each other by about 90 degrees, i.e., four increments of the angular positions.

The above arrangement causes contact finger 31 to contact signal contact 37C at the positions from position Nos. 4 to 7, and therefore, signal terminal 34C outputs the output codes corresponding to the four consecutive shaded cells of the output of terminal 34C shown in FIG. 5. At the positions from position Nos. 8 to 11, contact finger 31 is removed from signal contact 37C, but instead, contact finger 32 contacts signal contact 37C, so that signal terminal 34C outputs the output codes corresponding to the four consecutive shaded cells of the output pf terminal 34C shown in FIG. 5. As a result, signal terminal 34C outputs the output codes having eight consecutive shaded cells during the positions from positions No. 4 to 11 as the output of terminal 34C shown in FIG. 5.

The difference of the angular positions of contact fingers 31 and 32 may be slightly smaller than 90 degrees by an angle smaller than the angle of one increment. This arrangement allows both of contact fingers 31 and 32 contact signal contact 37C when the angular position changes from position No. 7 to position No. 8. This operation allows the contacting of contact finger 31 and signal contact 37C to reliably change into the contacting of contact finger 32 and signal contact 37C, preventing fluctuation of the output code at transition from position No. 7 to position No. 8.

In the positions from position Nos. 8 to 11, contact finger 31 contacts signal contact 37D, and signal terminal 34D outputs the output codes corresponding to four consecutive shaded cells from position Nos. 8 to 11 of the output of terminal 34D shown in FIG. 5. Further, in the positions from position Nos. 12 to 15, contact finger 31 is removed from signal contact 37D, but instead, contact finger 32 contacts signal contact 37D, so that signal terminal 34D outputs the output codes corresponding to the four consecutive shaded cells from position Nos. 12 to 15 of the outputs of terminal 34D shown in FIG. 5.

The above structure provides the output code of the eight angular positions from position Nos. 8 to 15 corresponding to the eight consecutive shaded cells from position Nos. 8 to 15.

The difference of the angular positions of contact fingers 31 and 32 may be slightly smaller than 90 degrees by an angle smaller than the angle for one increment. This arrangement allows the contacting of contact finger 31 and signal contact 37D to reliably change into the contacting of contact finger 32 and signal contact 37D, preventing fluctuation of the output code at transition from position No. 11 to position No. 12.

Conventional rotary encoder 500 shown in FIGS. 10 to 14 includes five circular tracks arranged concentrically: four for disposing each of signal contacts 15A to 15D; and one for disposing common contact 14. As a result, contact pattern 6 has large dimensions in view from above, preventing rotary encoder 500 from having a small size.

As described above, rotary encoder 1000 according to Embodiment 1 can detect sixteen angular positions of operating knob 24 as the Gray code. In contact pattern 26, common contact 36 is disposed on circular track T1 that is the closest to center point 21C; signal contacts 37A and 37B are disposed on circular track T3 that is the farthest from center point 21C; and signal contacts 37C and 37D are disposed on circular track T2 next to the closest track. Signal contacts 37A to 37D are arranged while sharing tracks T1 to T3 arranged concentrically. This arrangement allows rotary encoder 1000 to have the tracks fewer than those of conventional rotary encoder 500, and reduces the size of contact pattern 26, hence providing absolute-type rotary encoder 1000 with a small size.

Rotary encoder 1000 according to Embodiment 1 outputs the output codes of 4 bits, but it is not limited. The encoder may output an output code of n-bits (n is an integer not smaller than 2) by detecting $2^n$ angular positions. In rotary encoder 1000 that detects the $2^n$ angular positions, except for the MSB of the output code (the n-th bit), the pattern of blank cells and shaded cells of the bits of the output code is symmetrical (i.e. mirror image) with about a middle angular position that divides the $2^n$ positions in half. At the n-th bit as the MSB, the middle angular position is the boundary between the blank cells in the first half of the angular positions and the shaded cells in the second half of the angular positions.

The n-bit output codes conform to functions as follows. Having the value of "0" of each bit of the output code replaced with the value of "−1", the output of the bits except for the MSB conforms to an even function having the middle angular position as an origin. The output of the MSB conforms to an odd function having the middle angular position as the origin. Natural number n may be an even number or an odd number.

An absolute-type rotary encoder having n-bit output code having more than four bots includes signal contacts for obtaining the output signal of respective bits. Signal contacts out of the signal contacts corresponding to two bits, a certain bit and a bit adjacent to the certain bit, are disposed on a single track. Two contact fingers slides on the track while being located at angular positions different from each other by about 180 degrees corresponding to $2^n/2$ increments of the angular positions.

The concentrically arranged tracks (T2 and T3) on which signal contacts (37A to 37D) may be positioned preferably as follows. The signal contact corresponding to the LSB is disposed on track T3 that is the farthest from center point 21C among tracks T2 and T3. The signal contact corresponding to the MSB is disposed on track T2 that is the closest to center point 21C. In binary code such as Gray code, a lower bit changes more frequently. A signal contact for a lower bit occupies a narrow angular range about center point 21C. Positioning the lower-bit signal contact on a track farther from center point 21C allows the signal contact to have a long circumferential length, accordingly detecting the narrow angular range of the signal contact accurately.

In the case that the natural number n is an even number, as described above, the two independent signal contacts for obtaining the output signals of the n-th bit (as MSB) and the (n−1)-th bit are disposed on a single track, and the two contact fingers sliding on the track are positioned at angular positions different from each other by about 90 degrees corresponding to $2^n/4$ increments of the angular position.

Two signal contacts are disposed on one track in lower-to-higher order from the signal contact for the LSB, as described above. In the case that the natural number n is an odd number, the remaining signal contact for the MSB is disposed alone on one track, and one contact finger slides on the remaining signal contact.

In contact pattern 26 of rotary encoder 1000 according to Embodiment 1, common contact 36 having the annular shape is disposed on circular track T1 having center point 21C as a center thereof, and contact finger 28 slides on common contact 36 on track T1. In rotary encoder 1000 according to Embodiment 1, common contact 36 may have a circular shape having a small area including center point 21C. Instead of common contact 36 and contact finger 28, rotatable conductor 27 may always contact common terminal 33 via, for example, the side wall disposed around bearing 22 and recess 21A. This structure provides rotary encoder 1000 with a small size.

Contact finger 30 sliding on signal contacts 37A and 37B disposed on track T3 is located at an angular position different from contact finger 29 sliding on signal contacts 37A and 38B by predetermined angular difference A1 (180 degrees according to Embodiment 1). Signal contact 37A is located on part T3A of track T3 located within predetermined angular difference A1. Signal contact 37B is located on part T3B of track T3 located different from part T3A of track T3. Each of contact fingers 29 and 30 slides on both of signal contacts 37A and 37B. Signal contact 37A is not located on part T3B of track T3. Signal contact 37B is not located on part T3A of track T3.

In rotary encoder 1000 according to Embodiment 1, the number of the tracks arranged concentrically can be reduced, and allows recess 21A opening upward to have a smaller size and than that of the conventional rotary encoder, accordingly reducing the size of absolute-type n-bit rotary encoder 1000.

As described above, rotary encoder 1000 includes rotatable conductor 27 and signal contacts 37A to 37D. Rotatable conductor 27 includes contact fingers 29 to 32. Contact finer 29 slides on track T3 which is at least a part of the circle having center point 21C as a center thereof. Contact finger 30 slides on track T3 and is located at an angular position different from an angular position of contact finger 29 by about 180 degrees. Contact finger 31 slides on track T2 that is at least a part of the circle having center point 21C as a center thereof. Contact finger 32 slides on track T2 and is located at an angular position different from contact finger 31 by about 90 degrees. Signal contact 37A is disposed on track T3 and is configured to output a signal according to the angular position of rotatable conductor 27 rotating about center point 21C. Signal contact 37B is disposed on track T3 and is configured to output a signal according to the angular position of rotatable conductor 27 rotating about center point 21C. Signal contact 37B is electrically independent of signal contact 37A. Signal contact 37C is disposed on track T2 and is configured to output a signal according to the angular position of ratatable conductor rotating about center point 21C. Signal contact 37D is disposed on track T2 and is configured to output a signal according to the angular position of rotatable conductor 27 rotating about center point 21C. Signal contact 37D is electrically independent of signal contact 37C. Signal contacts 37A to 37D are arranged such that the signal output from signal contact 37D with respect to the angular position of roratable conductor 27 conforms to an odd function in a range of the angular position in which the signals output from signal contacts 37A to 37C with respect to the angular position of roratable conductor 27 conform to an even function.

Exemplary Embodiment 2

Figure 6:
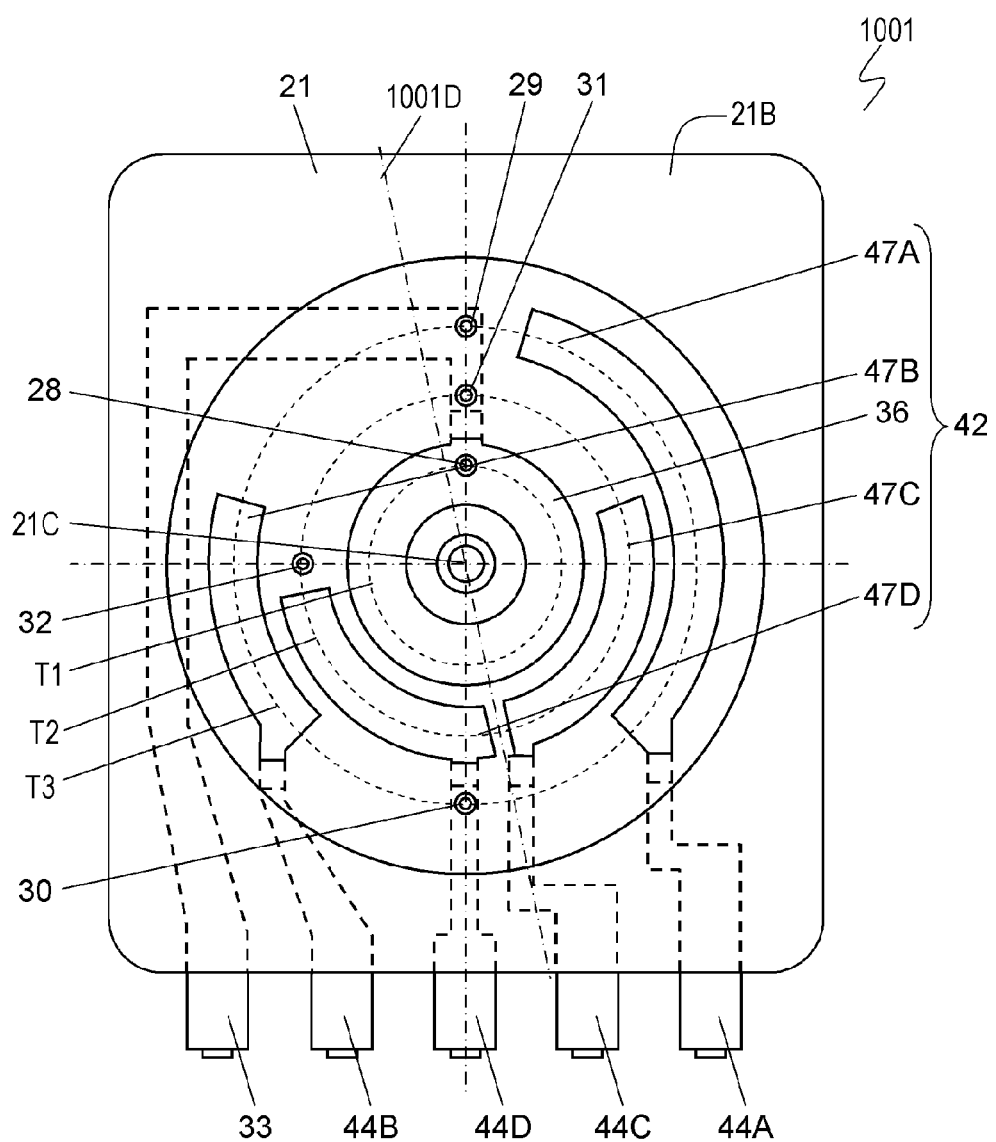
FIG. 6 is a schematic view of a rotary encoder in accordance with Exemplary Embodiment 2 of the invention.
Figure 7:
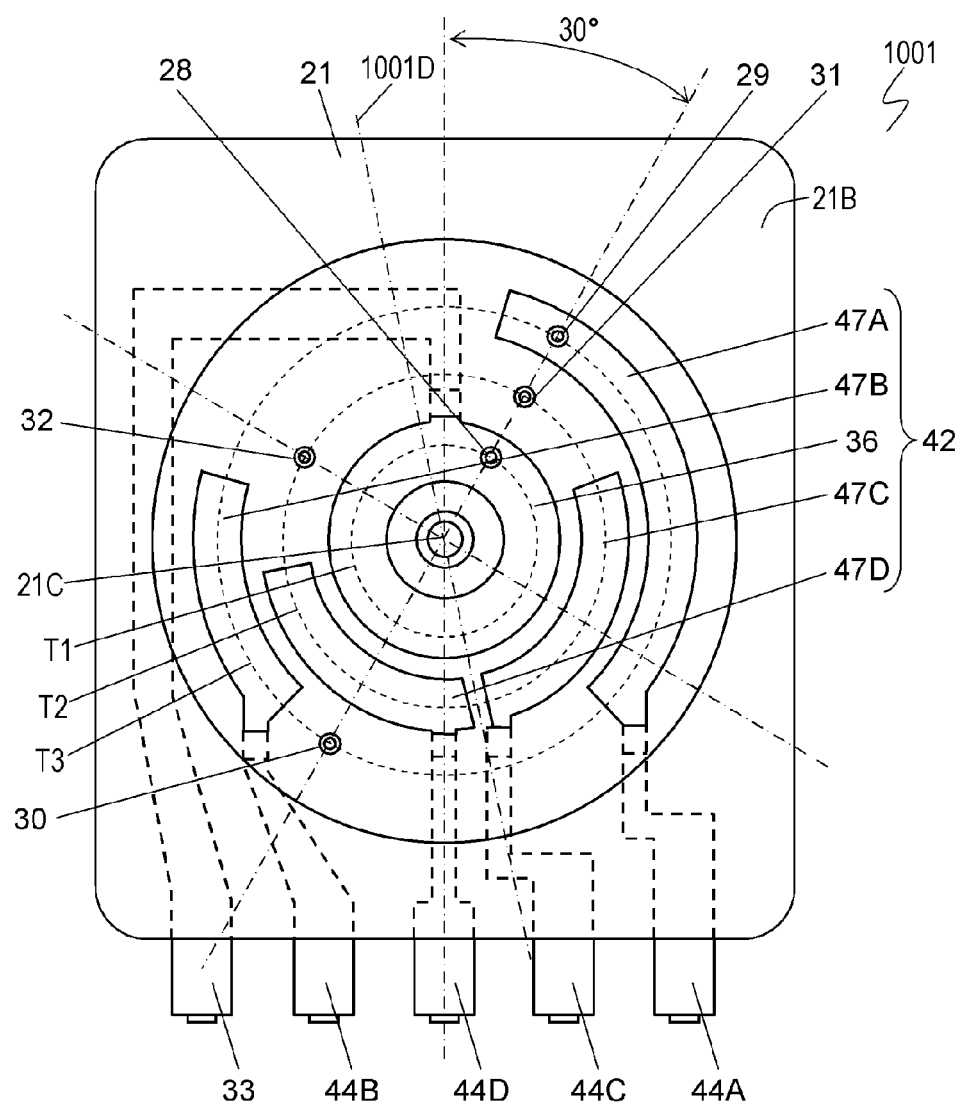
FIG. 7 is a schematic view of the rotary encoder in accordance with Embodiment 2.

FIG. 6 is a schematic view of rotary encoder 1001 according to Exemplary Embodiment 2 of the present invention. FIG. 7 is a schematic view of rotary encoder 1001. FIG. 8 shows output codes obtained by rotary encoder 1001. In FIGS. 6 to 8, components identical to those of rotary encoder 1000 according to Embodiment 1 shown in FIGS. 1 to 5 are denoted by the same reference numerals. Absolute-type rotary encoder 1000 according to Embodiment 1 outputs output codes indicating to sixteen angular positions. Absolute-type rotary encoder 1001 according to Embodiment 2 outputs the output codes indicating twelve angular positions.

Rotary encoder 1001 according to Embodiment 2 includes contact pattern 42 and signal terminals 44A to 44D instead of contact pattern 26 and signal terminals 34A to 34D of rotary encoder 1000 according to Embodiment 1 shown in FIGS. 1 to 5. Contact pattern 42 is disposed on bottom surface 21B of recess 21A of case 21 made of insulating resin. The structure of contact pattern 42 and the output codes corresponding to the twelve angular positions will be described below.

As shown in FIGS. 6 and 7, upon rotating about center axis 1000C, operating knob 24 causes rotatable conductor 27 fixed to the lower part of operating knob 24 by calking to rotate, accordingly causing contact fingers 28 to 32 of rotatable conductor 27 to be connected and disconnected with contact pattern 42 according to an angular position of rotatable conductor 27. The connection and disconnection causes signal terminals 44A to 44D led out from a side surface of case 21 to output codes having four bits shown in FIG. 8.

Rotary encoder 1001 according to Embodiment 2 allows operating knob 24 to rotate infinitely, and outputs the output codes having four bots shown in FIG. 8 corresponding to twelve angular positions. An angular increment by one angular position is 30 degrees.

The output codes (the first to fourth bits) and outputs of terminals (44A to 44D) shown in FIG. 8 are the output codes output from signal terminals 44A to 44D similarly to the rotary encoder according to Embodiment 1. The contacting status in which signal terminals 44A to 44D have the same potential as common terminal 33 is represented by "1" as the output code and a shaded cell as outputs of terminals (44A to 44). The non-contacting status in which signal terminals 44A to 44D are removed from common terminal 33 is represented by "1" as the output codes and a blank cell as outputs of terminals (44A to 44).

The output codes at the twelve angular positions shown in FIG. 8 are provided by deleting output codes at position Nos. 3, 4, 11, and 12 out of the output codes at the sixteen angular positions according to Embodiment 1 shown in FIG. 5. In other words, the output codes at position Nos. 0 to 11 shown in FIG. 8 correspond to the remaining output codes at position Nos. 0, 1, 2, 5, 6, 7, 8, 9, 10, 13, 14, and 15. The output codes shown in FIG. 8 are a Gray code in which only one bit changes due to a transition of any pair of angular positions of operation knob 24 adjacent to each other, similarly to the regularity of the Gray code shown in FIG. 5 according to Embodiment 1, That is, the pattern constituted by the blank cells and the shaded cells except for the fourth bit, the MSB, corresponding to the output of terminal 44D shown in FIG. 6 exhibits mirror images with respect to middle angular position 1001D located between position No. 5 and position No. 6 as the boundary that divides the twelve angular positions into half. In the fourth bit as the MSB, the cells from position Nos. 0 to 5 before middle angular position 1001D are all black cells, whereas the cells from position Nos. 6 to 11 after middle angular position 1001D are all shaded cells.

The pattern described above conforms to functions as follows. Having the value #0# with the value "−1", the signals output from signal terminals 44A to 44C for the first to third bits conform to an even function with respect to the angular position of the rotatable conductor having middle angular position 1001D as an origin. As for the fourth bit (the MSB), the signals output from signal terminal 44D conform to an odd function with respect to the angular position of the rotatable conductor having middle angular position 1001D as the origin.

In the first and second bits, the values from position Nos. 0 to 5 and the values from position Nos. 6 to 11 are the same in order. That is, the order of the values from position Nos. 0 to 5 is repeated in the cells in position Nos. 0 to 11.

Regarding eth regularity of the codes in the third and fourth bits of the output code will be described below. In the third and fourth bits, each of outputs of terminals 44C and 44D has six shaded cells consecutively arranged in position Nos. 0 to 11, and the rest of the cells are blank cells. The output pattern of the fourth bit (MSB) advances the output pattern of the third bit by three angular positions.

Based on the above regularity, rotary encoder 1001 configured to detect twelve angular positions includes plural signal contacts disposed on one track out of a circle of concentric circles, as shown in FIGS. 6 and 7, thereby having a small size.

In contact pattern 42, common contact 36 having an annular shape is disposed entirely on track T1, one of concentric circles, that is the closest to center point 21C.

Signal contacts 47A and 47B are disposed on track T3 that is the farthest from center point 21C. To be specific, signal contact 47A, having the pattern of outputs of signal terminal 44A from position Nos. 0 to 5 shown in FIG. 8 is disposed on a first half of track T3 from position Nos. 0 to 5. Signal contact 47B having a pattern of outputs of signal terminal 44B from position Nos. 0 to 5 shown in FIG. 8 is disposed on a second half of track T3 from position Nos. 6 to 11.

Signal contacts 47C and 47D are disposed on track T2 that is the second farthest from center point 21C. Signal contact 47C having a pattern of outputs of signal terminal 44C from position Nos. 0 to 5 shown in FIG. 8 is disposed on a first half of track T3 from position Nos. 0 to 5. Signal contact 47D having a pattern of outputs of signal terminal 44D from position Nos. 6 to 8 shown in FIG. 8 is disposed on a second half of track T2 from position Nos. 6 to 8.

With the structure above, at the positions from position Nos. 0 to 5, contact finger 29 slides on signal contact 47A on track T3, and signal terminal 44A outputs output codes corresponding to outputs of terminal 44A from position Nos. 0 to 5 shown in FIG. 8. At the positions from position Nos. 6 to 11, contact finger 30 slides on signal contact 47A on track T3, and signal terminal 44A outputs output codes again corresponding to outputs of terminals 44A from position Nos. 0 to 5 shown in FIG. 8. As described above, in the outputs of terminal 44A from position Nos. 0 to 11 shown in FIG. 8, the order of outputs of terminal 44A from position Nos. 6 to 11 is the same as that from position Nos. 0 to 5.

Similarly, at the positions from position Nos. 0 to 5, contact finger 30 slides on signal contact 47B on track T3. At the positions from position Nos. 6 to 11, contact finger 29 slides on signal contact 47B on track T3. That is, the output codes obtained at position Nos. 0 to 5 is repeated in the same order, thereby providing the output codes of outputs of terminal 44B from position Nos. 0 to 11.

On track T2, the second track out of the tracks arranged concentrically from center point 21C, contact finger 31 slides on signal contact 47C at the positions from position Nos. 3 to 5 of track T2, and signal terminal 44C outputs the output codes represented by the three shaded cells arranged consecutively from position Nos. 3 to 5 of outputs of terminal 44C shown in FIG. 8. At the positions from position Nos. 6 to 8, contact finger 31 is removed from signal contact 47C, and instead, contact finger 32 slides on signal contact 47C, and therefore, signal terminal 44C outputs the output codes represented by the three shaded cells arranged consecutively from position Nos. 6 to 8 of outputs of terminal 44C shown in FIG. 8. Contact finger 31 contacts signal contact 47D at the position from position Nos. 6 to 8, and therefore, signal terminal 44D outputs the output codes corresponding to the three shaded cells consecutively arranged in outputs of terminal 44D shown in FIG. 8. At the positions from position Nos. 9 to 11, contact finger 31 is removed from signal contact 47D, and instead, contact finger 32 contacts signal contact 47D, thereby allowing signal terminal 44C to output the output codes corresponding to another three consecutive shaded cells of outputs of terminal 44C shown in FIG. 8. As a result, signal terminal 44C outputs the output codes having six consecutive shaded cells of outputs of terminal 44C shown in FIG. 8.

As described above, track T3 is shared with signal contacts 47A and 47B, and track T2 is shared with signal contacts 47C and 47D. This structure allows absolute-type rotary encoder 1001 to detect twelve angular positions with output codes having four bits.

The angular difference between contact fingers 31 and 32 sliding on track T2 as the second track from center point 21C may be slightly smaller than 90 degrees by an angle smaller than the angle of one increment. This arrangement allows contact fingers 31 and 32 contact signal contact 47C when the angular position changes from position No. 5 to position No. 6. This allows the contacting status of contact finger 31 and terminal contact 47C to reliably change into the contacting status of contact finger 32 and signal contact 47C. Similarly, when the angular position changes from position No. 8 to position No. 9, the contacting status between signal contact 47C and each of contact fingers 31 and 32 is switched reliably. This prevents fluctuation of output codes in transition from an angular position to the next position.

In the rotary encoders according to Embodiments 1 and 2, each of contact patterns 26 and 36 made of a thin metal sheet is formed in case 21 by insert molding, but it is not limited to. A wiring board having the contact pattern thereon may be used, or the contact pattern may be formed by printing conductive paste.

Rotary encoders 1000 and 1001 according to Embodiment 1 are cyclic absolute-type rotary encoders including operating knob 24 that is rotatable infinitely in one direction, but it is not limited to. Operating knob 24 may be rotatable within a range smaller than 360 degrees. In that case, each of track T1 to T3 is a part of a circle having center point 21C as a center thereof. That is, in rotary encoders 1000 and 1001 according to Embodiments 1 and 2, each of tracks T1 to T3 is at least a part of a circle having center point 21C as a center thereof.

Exemplary Embodiment 3

Figure 9:
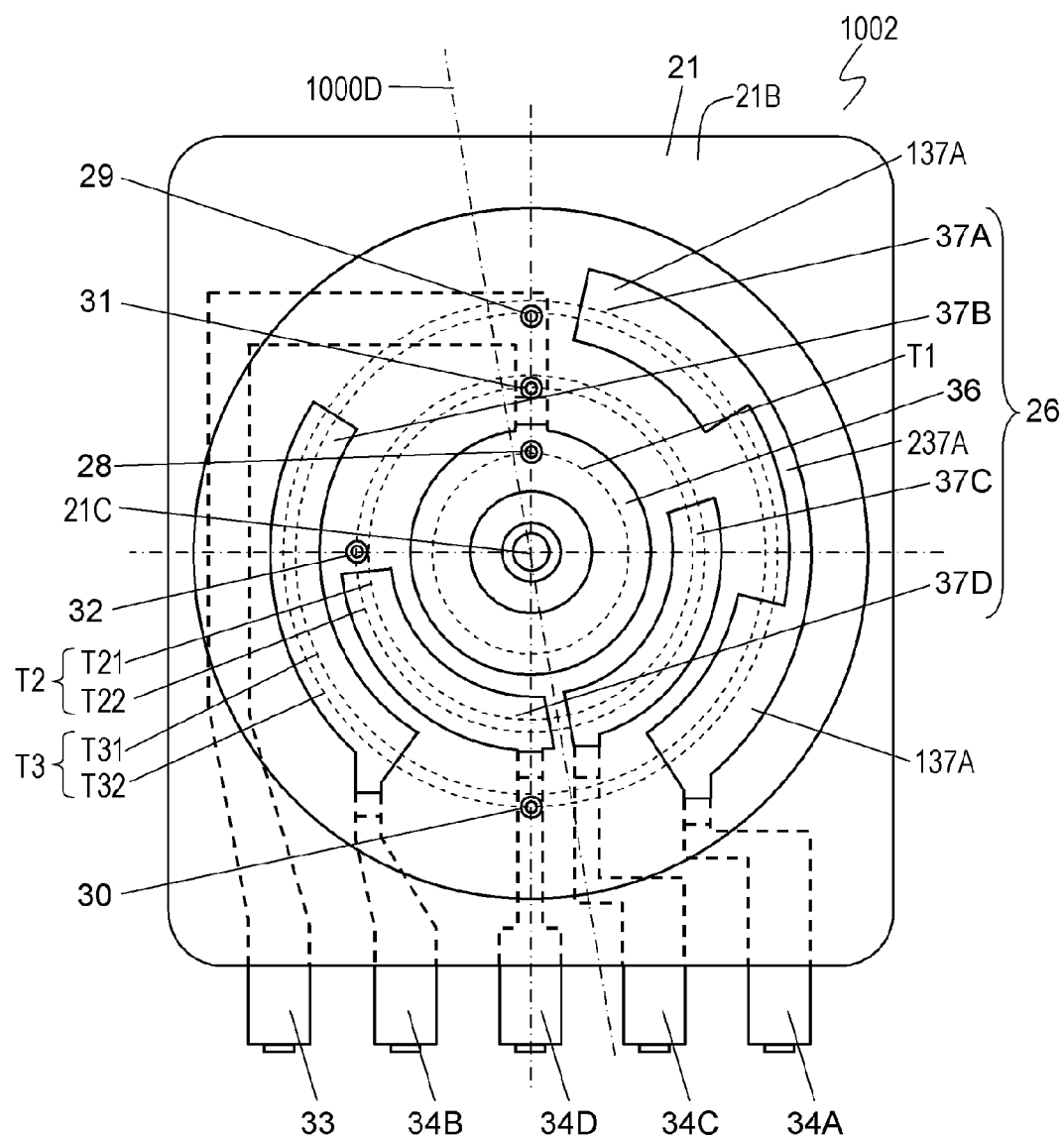
FIG. 9 is a schematic view of a rotary encoder in accordance with Exemplary Embodiment 3 of the invention.
Figure 10:
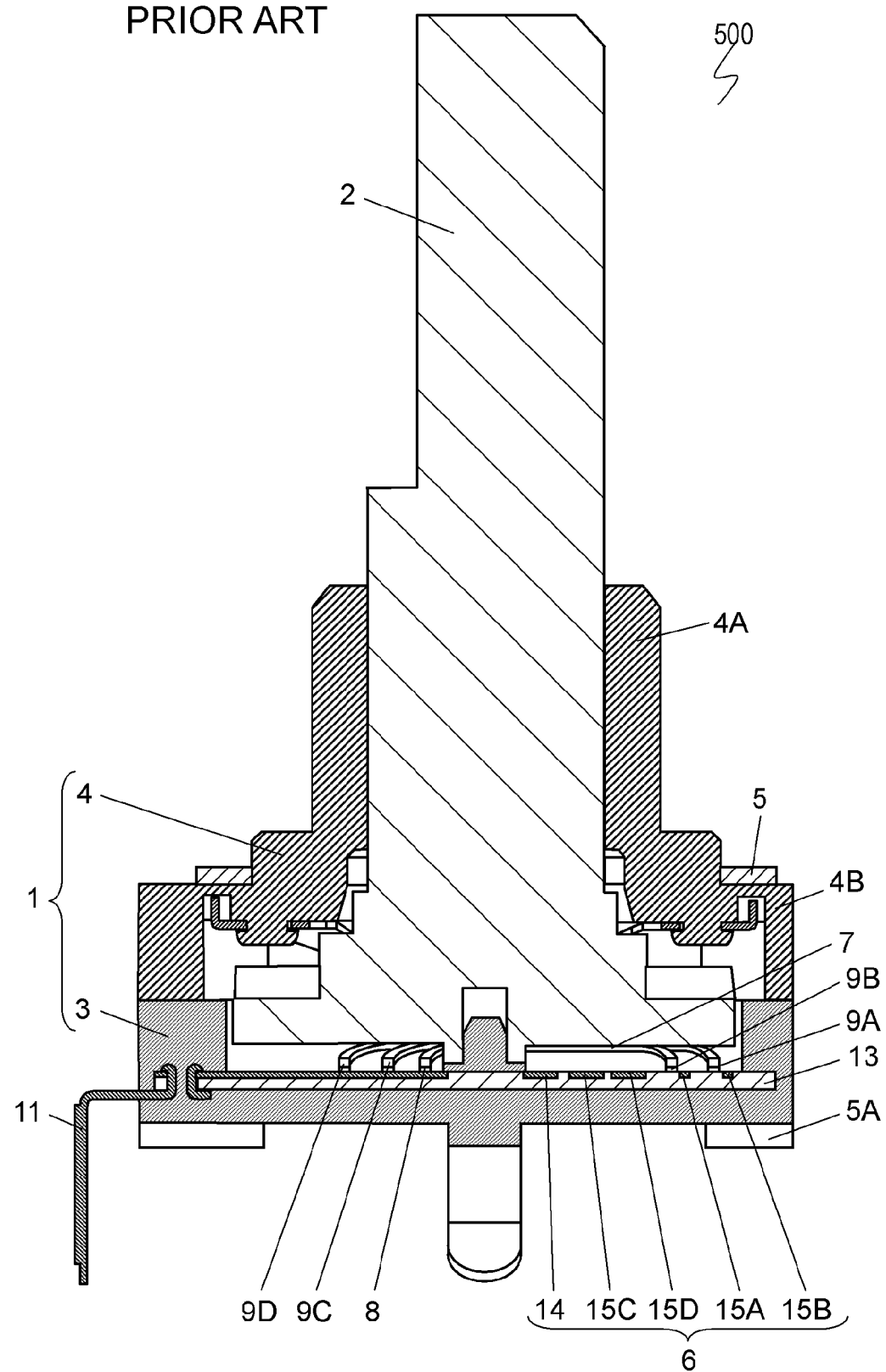
FIG. 10 is a cross-sectional view of a conventional rotary encoder.
Figure 11:
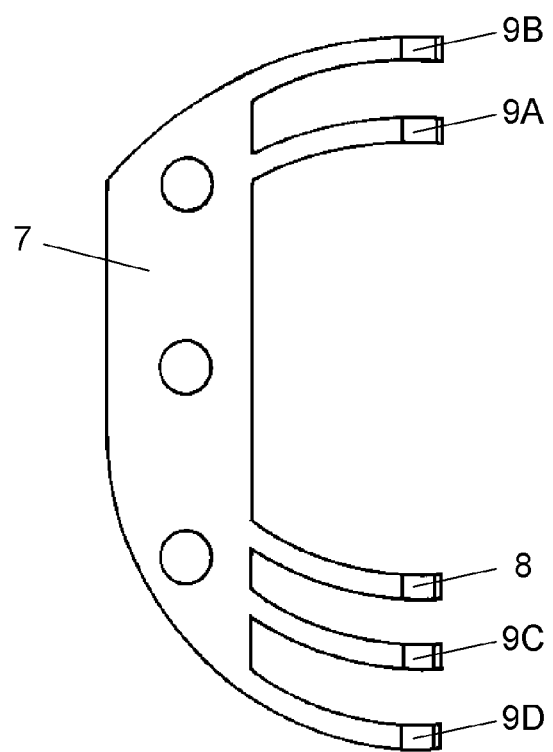
FIG. 11 is a plan view of a rotatable conductor of the conventional rotary encoder.
Figure 12:
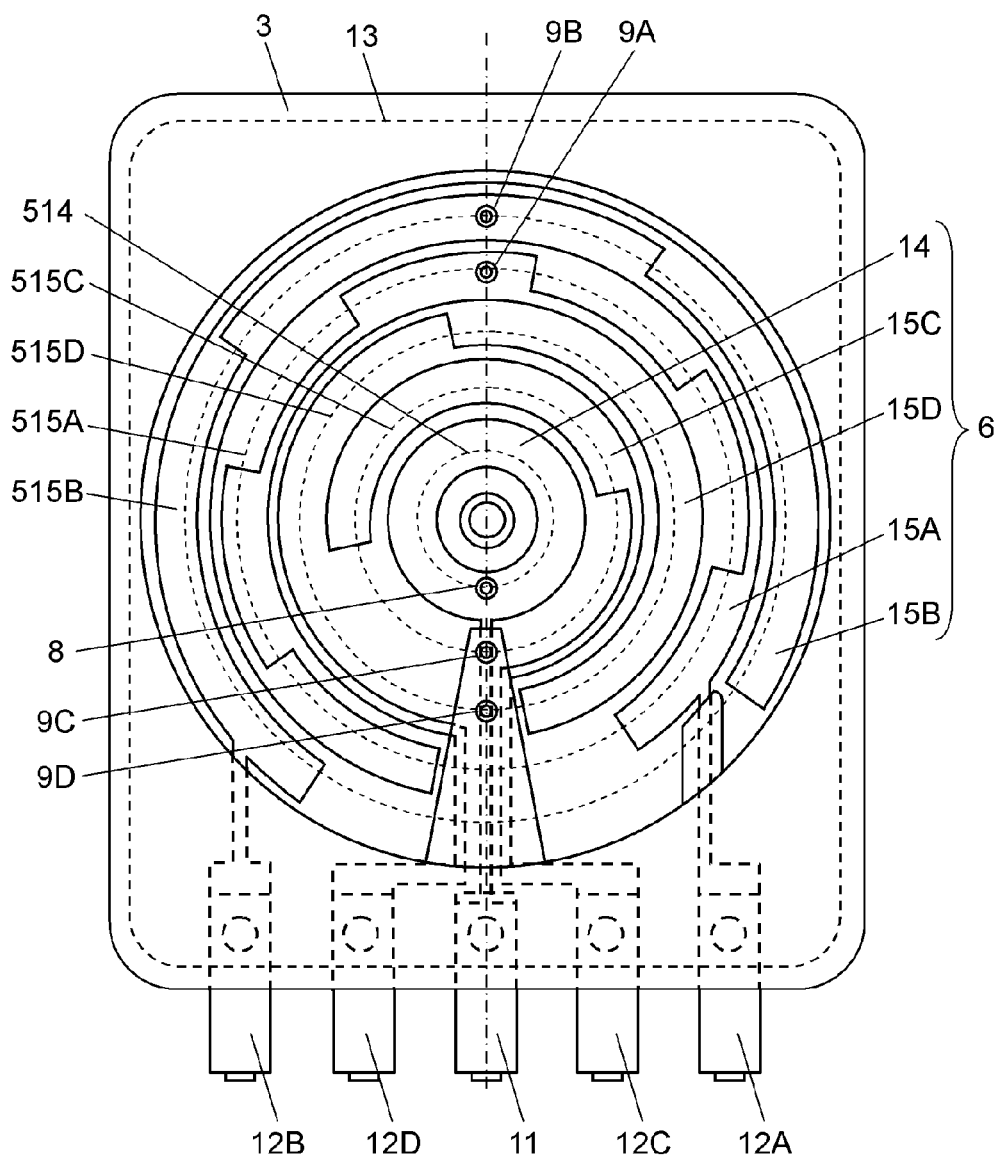
FIG. 12 is a schematic view of the conventional rotary encoder.
Figure 13:
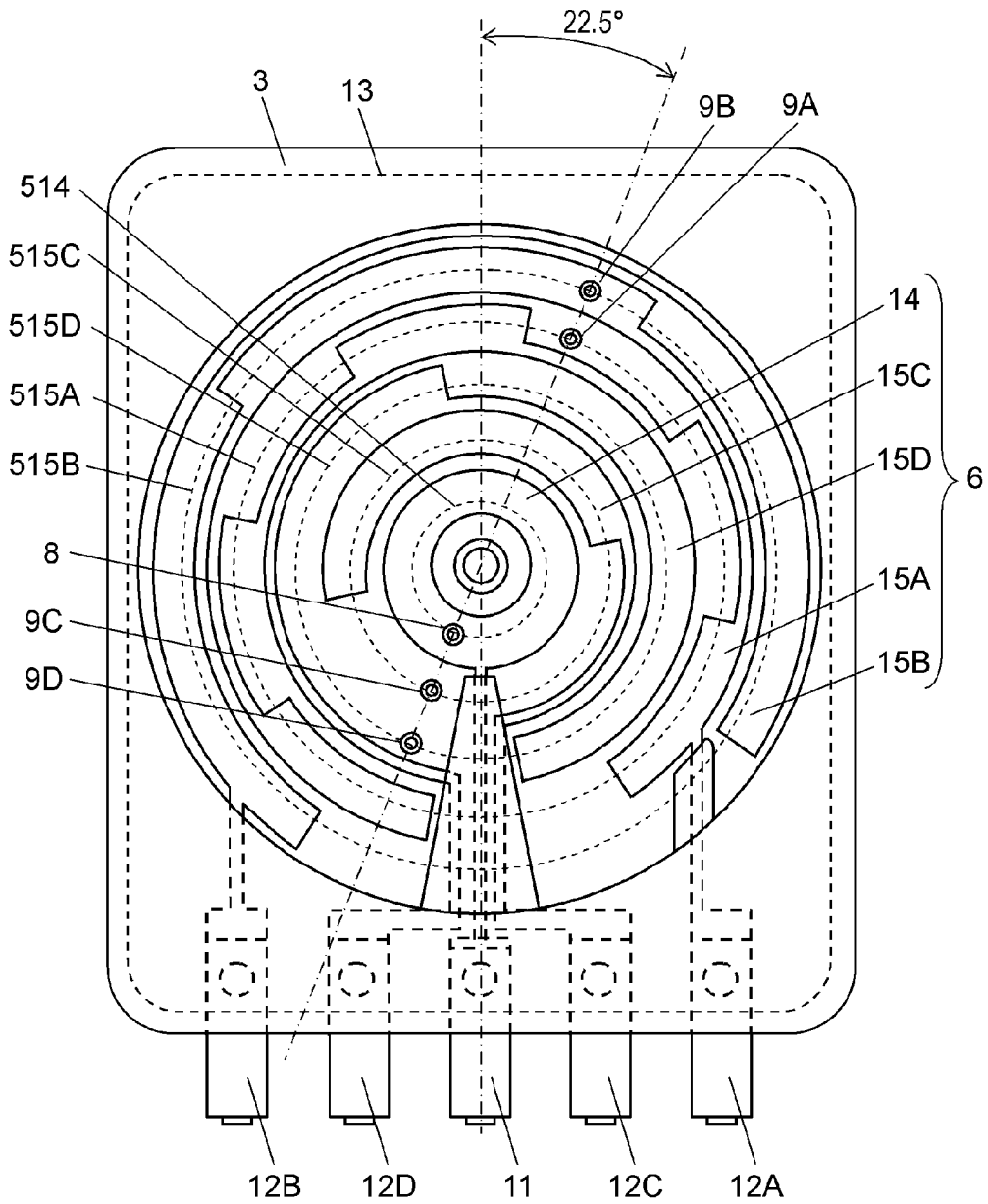
FIG. 13 is a schematic view of the conventional rotary encoder.

FIG. 9 is a schematic view of rotary encoder 1002 according to Exemplary Embodiment 3. In FIG. 9, components identical to those of rotary encoder 1001 according to Embodiment 1 shown in FIG. 3 are denoted by the same reference numerals. In rotary encoder 1002 shown in FIG. 9, each of the concentric tracks having center point 21C includes two sub-tracks having different diameters. To be specific, track T2 includes sub-tracks T21 and T22 while track T3 includes sub-tracks T31 and T32. Sub-tracks T21, T22, T31, and T32 are disposed on concentric circles having center point 21C as a center thereof.

In rotary encoder 1002 according to Embodiment 3 shown in FIG. 9, contact finger 31 slides on sub-track T21, whereas contact finger 32 slides on sub-track T22. Similarly, contact finger 29 slides on sub-track T31, whereas contact finger 30 slides on sub-track T32. That is, only one contact finger slides on one sub-track.

In rotary encoder 1000 according to Embodiment 1 shown in FIG. 3, two contact fingers 31 and 32 slide on track T2, and two contact fingers 29 and 30 slide on track T2. In contrast, in rotary encoder 1002 according to Embodiment 3 shown in FIG. 9, only one contact finger slides on one sub-track. The structure decreases abrasion and deformation of signal contacts 37A to 37D and bottom surface 21B of recess 21A of case 21 due to the sliding of contact fingers 29 to 32. Reducing the distance between the sub-tracks T21 and T22 and the distance between sub-tracks T31 and T32 can locate the sub-tracks on bottom surface 21B of recess 21A within a moderate size, providing rotary encoder 1002 with a small size.

Sub-tracks T21, T22, T31, and T32 are applicable to rotary encoder 1001 according to Embodiment 2 and provide the same effects.

What is claimed is:

1. A rotary encoder comprising:
  a rotatable conductor including:
    a first contact finger that slides on a first track which is at least a part of a circle having a center point as a center thereof;
    a second contact finger that slides on the first track, the second contact finger being located at an angular position different from an angular position of the first contact finger by about 180 degrees,
    a third contact finger that slides on a second track which is at least a part of a circle having the center point as a center thereof, and
    a fourth contact finger that slides on the second track, the fourth contact finger being located at an angular position different from an angular position of the third contact finger by about 90 degrees;
  a first signal contact disposed on the first track, the first signal contact being configured to output a first signal according to an angular position of the rotatable conductor about the center point;
  a second signal contact disposed on the first track, the second signal contact being configured to output a second signal according to the angular position of the rotatable conductor, the second signal contact being electrically independent of the first signal contact;
  a third signal contact disposed on the second track, the third signal contact being configured to output a third signal according to the angular position of the rotatable conductor; and
  a fourth signal contact disposed on the second track, the fourth signal contact being configured to output a fourth signal according to the angular position of the rotatable conductor, the fourth signal contact being electrically independent of the third signal contact,
  wherein the first signal contact, the second signal contact, the third signal contact, and the fourth signal contact are arranged such that the fourth signal conforms to an odd function with respect to the angular position of the rotatable conductor within a range of the angular position of the rotatable conductor in which the first signal, the second signal, and the third signal conform to an even function with respect to the angular position of the rotatable conductor.

2. The rotary encoder according to claim 1,
  wherein the first track includes:
    a first sub-track which is at least a part of a circle having the center point as a center thereof, the first contact finger of the rotatable conductor sliding on the first sub-track; and
    a second sub-track which is at least a part of a circle having the center point as a center thereof, the second contact finger of the rotatable conductor sliding on the second sub-track, and
  wherein each of the first signal contact and the second signal contact is disposed on both the first sub-track and the second sub-track.

3. The rotary encoder according to claim 2,
  wherein the second track includes:
    a third sub-track which is at least a part of a circle having the center point as a center thereof, the third contact finger of the rotatable conductor sliding on the third sub-track; and
    a fourth sub-track which is at least a part of a circle having the center point as a center thereof, the fourth contact finger of the rotatable conductor sliding on the fourth sub-track, and
  wherein each of the third signal contact and the fourth signal contact is disposed on both the third sub-track and the fourth sub-track.

4. The rotary encoder according to claim 1,
  wherein the second track includes:
    a first sub-track which is at least a part of a circle having the center point as a center thereof, the third contact finger of the rotatable conductor sliding on the first sub-track; and
    a second sub-track which is at least a part of a circle having the center point as a center thereof, the fourth contact finger of the rotatable conductor sliding on the second sub-track, and
  wherein each of the third signal contact and the fourth signal contact is disposed on both the first sub-track and the second sub-track.

5. A rotary encoder comprising:
  a rotatable conductor including:
    a first contact finger that slides on a track which is at least a part of a circle having a center point as a center thereof; and
    a second contact finger that slides on the track, the second contact finger being located at an angular position different from an angular position of the first contact finger by about 180 degrees;
  a first signal contact disposed on the track, the first signal contact being configured to output a first signal according to an angular position of the rotatable conductor about the center point; and
  a second signal contact disposed on the track, the second signal contact being configured to output a second signal according to the angular position of the rotatable conductor, the second signal contact being electrically independent of the first signal contact,
  wherein the first signal contact and the second signal contact are arranged such that the first signal and the second signal conform to an even function with respect to the angular position of the rotatable conductor.

* * * * *